United States Patent
McGraw et al.

(10) Patent No.: US 7,672,790 B2
(45) Date of Patent: Mar. 2, 2010

(54) SYSTEM AND METHOD FOR STOCHASTIC DT-MRI CONNECTIVITY MAPPING ON THE GPU

(75) Inventors: Tim McGraw, Morgantown, WV (US); Mariappan S. Nadar, Plainsboro, NJ (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 176 days.

(21) Appl. No.: 11/843,102

(22) Filed: Aug. 22, 2007

(65) Prior Publication Data

US 2008/0109171 A1    May 8, 2008

Related U.S. Application Data

(60) Provisional application No. 60/856,120, filed on Nov. 2, 2006.

(51) Int. Cl.
*G01N 24/00* (2006.01)
*G01V 3/14* (2006.01)

(52) U.S. Cl. ............... 702/19; 324/307; 324/309; 324/312; 345/501; 345/522; 345/419; 345/424; 345/442

(58) Field of Classification Search ............ None
See application file for complete search history.

(56) References Cited

OTHER PUBLICATIONS

Kondratieva P, Kruger J, Westermann R; "The Application of GPU Particle Tracing to Diffusion Tensor Field Visualization"; IEEE Visualization; 2005; pp. 73-78.*
Friman O, Farneback G, Westin C-F; "A Bayesian Approach for Stochastic White Matter Tractography"; IEEE Trans Med Imaging v 25 nr 8; Aug 2006; pp. 965-978.*
Behrens TEJ, Woolrich MW, Jenkinson M, Johansen-Berg H, Nunes RG, Clare S, Matthews PM, Brady JM, Smith SM; "Characterization and Propagation of Uncertainty in Diffusion-Weighted MR Imaging"; Magn Reson Med v 50; 2003; pp. 1077-1088.*
Kessenich J, Baldwin D, Rost R; "Overview of OpenGL Shading"; Chapter 3 of "The OpenGL Shading Language"; 3DLabs, Inc.; 2004; pp. 5-7.*
Westin C-F, Maier SE, Mamata H, Nabavi A, Jolesz FA, Kikinis R; "Processing and visualization for diffusion tensor MRI"; Med Imag Anal v 6; 2002; pp. 93-108.*
Zhang S, Demiralp C, Laidlaw DH; "Visualizing Diffusion Tensor MR Images Using Streamtubes and Streamsurfaces"; IEEE Trans Vis Comp Graph v 9 nr 4; Oct.-Dec. 2003; pp. 454-462.*

* cited by examiner

*Primary Examiner*—Michael Borin
*Assistant Examiner*—Soren Harward
(74) *Attorney, Agent, or Firm*—Donald B. Paschburg; F. Chau & Associates, LLC

(57) ABSTRACT

A graphics processing unit implemented method for fiber tract mapping from diffusion tensor magnetic resonance imaging data includes providing a diffusion tensor magnetic resonance brain image volume, initializing a set of fiber positions in a 3D set of points, fiber displacements, and a posterior distribution for an updated fiber displacement in terms of the initial displacements and diffusion tensors, randomly sampling a set of updated fiber displacements from said posterior distribution, computing a new set of fiber positions from said initial fiber positions and said updated fiber displacements, wherein a fiber path comprises a set of fiber points connected by successive fiber displacements, accumulating connectivity values in each point of said 3D set of points by additive alpha-blending a scaled value if a fiber path has passed through a point and adding zero if not, and rendering said connectivity values.

22 Claims, 7 Drawing Sheets

Ellipsoid glyphs

Line integral convolution

Streamtubes

SYSTEM AND METHOD FOR STOCHASTIC DT-MRI CONNECTIVITY MAPPING ON THE GPU

CROSS REFERENCE TO RELATED UNITED STATES APPLICATIONS

This application claims priority from "Stochastic DT-MRI Connectivity Mapping on the GPU", U.S. Provisional Application No. 60/856,120 of Nadar, et al., filed Nov. 2, 2006, the contents of which are herein incorporated by reference.

TECHNICAL FIELD

This disclosure is directed to fiber tract mapping from diffusion tensor magnetic resonance imaging (DT-MRI).

DISCUSSION OF THE RELATED ART

Many neurological disorders are characterized by changes in brain white-matter connectivity, for example stroke, autism, trauma, Alzheimer's disease and multiple sclerosis. In additional, presurgical planning for epilepsy and tumor resection can make use of connectivity information. DT-MRI makes it possible to compute, in vivo, many useful quantities, including estimates of structural connectivity within neural tissue. Much clinical research is based on the use of pointwise indices such as diffusion anisotropy, mean diffusivity, estimated fiber tracts, or sparse connectivity matrices computed from diffusion weighted images. For example, mean diffusivity has been found to be a valuable measure for indicating tumors. The next step in the processing of DT-MRI is to analyze the full connectivity map: the connectivity between all pairs of points in the image. Fast computation and display of connectivity information can advance the clinical usefulness of DT-MRI. Nonfocal effects, such as those secondary to diffuse axonal injury, could also be studied using these methods. Since connectivity may be affected after an injury and far from the site of the injury, studying global connectivity measures is well justified. Reduced computation time will make these methods more attractive for use in a time critical settings, such as assessment of brain injury following stroke or trauma.

Tensor field visualization has been an active area of recent research. There are not only medical imaging applications, but also engineering applications, since mechanical stress and strain are also represented as tensors. The challenge of DT-MRI visualization is to simultaneously convey as much relevant information as possible: mean diffusivity, principal diffusion direction (PDD), anisotropy, and oblateness/prolateness of the diffusion ellipsoid. Many of these quantities can be computed from the elements of the tensor, D, at each voxel or from the eigenvalue decomposition of D: the PDD is the dominant eigenvector of D, fractional anisotropy (FA) is the normalized variance of the eigenvalues, mean diffusivity is the trace of D.

Glyph-based visualization relies on a small graphical icon at each voxel to represent a tensor. Ellipsoids can be computed by transforming the vertices of a triangulated sphere by the diffusion tensor, depicted in FIG. 1. The major axis of the ellipsoid is a good visual indicator of the principal diffusion direction. The shape of the ellipsoid is an indicator of anisotropy. However, the appearance of these glyphs can be uninformative at some viewing angles. Superquadric glyphs have been used to overcome this visual ambiguity. Another method of optimally placing glyphs to emphasize the PDD and the supposed direction of underlying neuronal fibers uses streamlines and streamtubes to visualize diffusion information. Streamlines are curves which are tangent to the PDD vector field at each point along the curve (also called integral curves). Streamtubes are cylindrical surfaces whose axis is a streamline. Although these are vector field visualization techniques, they can be adapted to reflect additional information about the tensor field. For example, tubes can be displayed with the radius proportional to the FA in order to convey information about the underlying tensor field, as depicted in FIG. 2. Particles are another discrete technique for representing a tensor field. In this case, the icon or glyph representing the tensor is not stationary, but advects through the PDD field, changing its appearance to reflect the tensor at its current position.

However, for large datasets, a glyph based display can become too dense. In 3D datasets the discrete glyphs and streamtubes often obscure each other. To overcome this, traditional volume visualization techniques such as raycasting and splatting can be applied to a field of scalar indices of the tensors, such as FA or tensor trace. Texture-based visualization techniques produce an image in which texture orientation and frequency reflect the tensor data. Line integral convolution (LIC) is a process of blurring or convolving a noise image with a curvilinear kernel aligned with the local streamline through each voxel, depicted in FIG. 3. The resulting image has highly correlated intensity values along each streamline, and uncorrelated intensity across streamlines. In a hybrid approach for rendering textured glyphs, the resulting glyphs can portray all 6 tensor components. The glyphs can be overlaid on a scalar image (FA, for example) resulting in a layered image. Streamline visualization can give a misleading impression of certainty. Although the PDD is usually a good estimate of the local fiber direction, many factors influence the quality of that estimate.

Inferring the integrity and trajectory of white-matter pathways in the central nervous system has long been a goal of DT-MRI analysis. Detecting the presence of nerve fiber bundles has been solved using scalar measures of diffusion magnitude and anisotropy. In DT-MRI, indices of anisotropy include FA, relative anisotropy, volume ratio and lattice anisotropy. These local indices are computed from the diffusion tensor at each voxel. FA has found success in clinical applications, being used to detect tissue damage after strokes. FA is attractive for its ease of computation and display, and robustness to noise in the data. Scalar indices make it possible to detect changes in neuronal fiber integrity, but do not indicate the degree to which connectivity has been compromised. They also do not describe the long-range implications of the change in anisotropy, such as which regions of the brain have been affected.

Tractography is the process of estimating white-matter fiber pathways. Early tractography methods were similar to streamline computations in fluid mechanics. Fibers are traced by repeatedly stepping in the local direction of principal diffusion. Such tractography methods are confounded by the presence of fiber crossings or bifurcations, and the algorithms usually handle these cases by simply halting the tracking progress. Some algorithms use regularizing assumptions to make the tracking robust to the presence of noise and anisotropy. Another approach is to allow the tensor to merely deflect the current fiber direction. High angular resolution diffusion imaging (HARDI) was developed to overcome the weakness of the tensor model when attempting to resolve complex tissue architecture. From this type of image a probability of water molecule displacement, the diffusion propagator, may be computed. Characterizing the PDD from the diffusion propagator is not as straightforward as it is in the tensor case since there is no tensor from which to compute eigenvectors.

In fact, there may be multiple significant diffusion directions since the propagator may have multiple modes.

Many recently proposed tractography algorithms are probabilistic in nature. While some techniques may generate families of possible fiber tracts, others eschew the fiber representation and instead produce probabilities of connectivity. Stochastic algorithms have an advantage over deterministic techniques in that it is more natural to take uncertainty into account. Uncertainty in diffusion tractography is due to a number of sources, including partial voluming and noise. By incorporating uncertainty or randomness into the tractography algorithm it is possible to compute and display distributions of fiber paths. Even though it may be possible within the stochastic framework to determine the most probable fiber path between two points, less probable paths may correspond to actual connectivity. The full distribution of possible fiber paths may have much clinical value. Bootstrap techniques have been used generate distributions of diffusion weighted image intensities which lead to distributions of fiber tracts. Bayesian models have enjoyed popularity in the context of fiber tracking due to the ability of these models to incorporate prior knowledge. Prior knowledge of fiber bending angle can be used to allow DT-MRI tractography to continue through voxels with low anisotropy. Monte Carlo techniques have been explored to solve for connectivity probabilities which are formulated as a high-dimension integral. Importance sampling has been used to generate large numbers of fiber tracts and visualize their dispersion. Other recently proposed algorithms are based on front propagation, geometric flow, geodesics on Riemannian manifolds, or numerical simulation of the diffusion process. These approaches do not address the efficient computation of global connectivity.

The drawbacks of the current methods are that (a) they require time-consuming computation or stochastic simulation and (b) the resulting output only describes connectivity between a sparse set of image voxels. Algorithm run-time is also a hindrance to practical use. Sparse connectivity matrices may miss critical regions of impaired connectivity corresponding to minor fascicles. The ability to efficiently compute full, global connectivity will allow DT-MRI to be used in new applications, both clinically and in further research.

Modern graphics hardware can be used to accelerate the display of medical image volume data. This hardware is also capable of speeding-up the processing of the data prior to visualization. General purpose graphics processing unit (GPGPU) algorithms can be used to solve partial differential equations, and finite element problems. In the field of medical image processing, GPGPU has been used for filtering, segmentation, registration and image reconstruction. In the context of DT-MRI, the GPU has been utilized for particle and streamtube based visualization techniques, but to date, nobody has performed stochastic tractography or connectivity matrix computation on the GPU.

SUMMARY OF THE INVENTION

Exemplary embodiments of the invention as described herein generally include methods and systems for stochastic modeling for fiber tract mapping from diffusion tensor MRI (DT-MRI). From the simulated fibers a connectivity map is computed that gives an indication of the probability that two points in the dataset are connected by a neuronal fiber path. A Bayesian formulation of the fiber model is used to show that the inversion method can construct a plausible connectivity. The fiber model is implemented on a graphics processing unit (GPU). Since the fiber paths can be stochastically generated independently of one another, the algorithm is highly parallelizable. This allows exploitation of the data parallel nature of the GPU fragment processors. The connectivity computation on the GPU generalizes to other fiber models by simple substitution of a single fragment program. The GPU implementation allows the user to interactively select regions of interest and observe the evolving connectivity results during computation. Results are presented from the stochastic generation of over 250,000 fiber steps per iteration at interactive frame rates on consumer-grade graphics hardware.

According to an aspect of the invention, there is provided a method for fiber tract mapping from diffusion tensor magnetic resonance imaging data, including providing a digitized brain image volume comprising a plurality of 3×3 diffusion tensors corresponding to a 3-dimensional grid of points, initializing a set of fiber positions in a 3D set of points, fiber displacements, and a posterior distribution for an updated fiber displacement in terms of the initial displacements and diffusion tensors, randomly sampling a set of updated fiber displacements from said posterior distribution, computing a new set of fiber positions from said initial fiber positions and said updated fiber displacements, wherein a fiber path comprises a set of fiber points connected by successive fiber displacements, accumulating connectivity values in each point of said 3D set of points by additive alpha-blending a scaled value if a fiber path has passed through a point and adding zero if not, and rendering said connectivity values, wherein the steps of sampling updated fiber displacements, computing a new set of fiber positions, accumulating connectivity values, and rendering said connectivity values are performed by a graphics processing unit.

According to a further aspect of the invention, the posterior distribution is proportional to $$\exp\left[-(\hat{\lambda}_1 - \hat{\lambda}_2)(v \cdot e_1)^2 - \hat{\lambda}_2 \|v_i\|^2 + \kappa\left(\frac{v_i}{\|v_i\|}\right)^T\left(\frac{v_{i-1}}{\|v_{i-1}\|}\right)\right],$$

wherein $v_i$ and $v_{i-1}$ are, respectively, the updated and initial fiber displacements, $e_1$ is a dominant eigenvalue of the diffusion tensor at a given point, $\hat{\lambda}_1 = 1/\lambda_1$ wherein $\lambda_1$ is the eigenvalue associated with $e_1$, $$\hat{\lambda}_2 = \frac{2}{\lambda_2 + \lambda_3}$$

wherein $\lambda_2$ and $\lambda_3$ are the other eigenvalues of the diffusion tensor, and $\kappa$ is parameter that characterizes how tightly said posterior distribution is dispersed about a mean direction.

According to a further aspect of the invention, the initial fiber positions and fiber displacements are stored as textures, said new fiber positions are output into a frame buffer object, and further comprising swapping said new fiber positions frame buffer object with a texture.

According to a further aspect of the invention, the steps of randomly sampling a set of updated fiber displacements and computing a new set of fiber positions are performed by a fragment program.

According to a further aspect of the invention, the method includes correcting said updated fiber displacements from said new set of fiber positions in a fragment program, outputting said corrected displacements to a frame buffer object, and swapping said frame buffer object with a texture.

According to a further aspect of the invention, the step of accumulating connectivity values is performed by a vertex program.

According to a further aspect of the invention, the method includes combining said initial fiber positions and said new fiber positions into a vertex buffer object that is an argument to said vertex program, outputting said connectivity values into a frame buffer object, and swapping said frame buffer object with a texture.

According to a further aspect of the invention, rendering said connectivity values includes mapping colors to said connectivity values.

According to a further aspect of the invention, the method includes terminating fiber track mapping of a fiber path when said fiber path exits said 3D set of points or if a normalized variance of the eigenvalues of the diffusion tensor of a point on the fiber path falls below a pre-determined threshold, and randomly reinitializing said terminated fiber path within the 3D set of points.

According to a further aspect of the invention, the method includes adjusting said randomly sampled displacements according to $\gamma v + (1-\gamma)\bar{v}$, wherein v is said randomly sampled displacement, $\bar{v}$ is an average value of said displacements, and $\gamma$ is a pre-determined parameter that corrects for undersampling said distribution.

According to a further aspect of the invention, initializing said posterior distribution includes stochastically interpolating values for $v_{i-1}$, $e_1$, $\hat{\lambda}_1$ and $\hat{\lambda}_2$.

According to a further aspect of the invention, the method includes stochastically interpolating a diffusion tensor $D(x)$ when a new fiber position x falls between set points, wherein $$D(x) = \begin{cases} D(\lfloor x \rfloor), & \text{if } U(0,1) > x - \lfloor x \rfloor, \\ D(\lceil x \rceil), & \text{otherwise,} \end{cases}$$

and wherein U(0,1) returns a random value uniformly distributed between 0 and 1.

According to another aspect of the invention, there is provided a program storage device readable by a computer, tangibly embodying a program of instructions executable by the computer to perform the method steps for fiber tract mapping from diffusion tensor magnetic resonance imaging data.

DETAILED DESCRIPTION OF EXEMPLARY EMBODIMENTS

Figure 1:
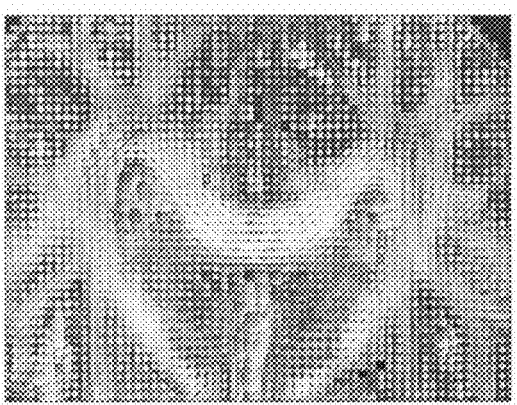
FIG. 1 illustrates glyph-based visualization of a tensor field, according to an embodiment of the invention.
Figure 3:
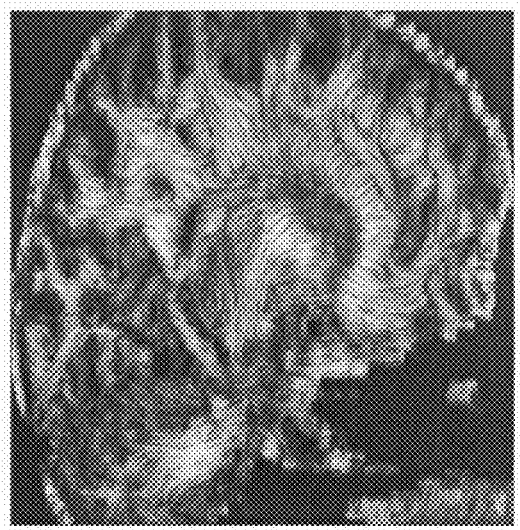
FIG. 3 depicts a line-integral convolution based visualization of a tensor field, according to an embodiment of the invention.
Figure 2:
FIG. 2 depicts the use of streamtubes to visualize a tensor field, according to an embodiment of the invention.

Exemplary embodiments of the invention as described herein generally include systems and methods for fiber tract mapping from diffusion tensor magnetic resonance imaging (DT-MRI) on the GPU. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data composed of discrete image elements (e.g., pixels for 2-D images and voxels for 3-D images). The image may be, for example, a medical image of a subject collected by computer tomography, magnetic resonance imaging, ultrasound, or any other medical imaging system known to one of skill in the art. The image may also be provided from non-medical contexts, such as, for example, remote sensing systems, electron microscopy, etc. Although an image can be thought of as a function from $R^3$ to R, the methods of the inventions are not limited to such images, and can be applied to images of any dimension, e.g., a 2-D picture or a 3-D volume. For a 2- or 3-dimensional image, the domain of the image is typically a 2- or 3-dimensional rectangular array, wherein each pixel or voxel can be addressed with reference to a set of 2 or 3 mutually orthogonal axes. The terms "digital" and "digitized" as used herein will refer to images or volumes, as appropriate, in a digital or digitized format acquired via a digital acquisition system or via conversion from an analog image.

The fragment processors of the GPU excel at performing independent data-parallel operations. By implementing the fiber generation on the GPU one can generate many fibers in parallel. Memory limitations on the GPU are one constraint that limits the use of techniques for large datasets, such as HARDI. Typically, the GPU may have between 256 MB and 1 GB of RAM. Although the GPU is a powerful parallel processor, there are limits to the complexity of fragment programs. Issues that complicate GPU programming include a small instruction set, very limited branch prediction, limited fragment program size, no random number generation, and restricted write access to memory. A simple fiber path model can avoid these issues.

Fiber Path Model

A fiber path is modeled as a sequence of displacement vectors $v_{1:n} = \{v_1, v_2, v_3, \ldots, v_n\}$. A fiber path starting at a point $x_0$ includes the points $\{x_0, x_1, x_2, \ldots, x_n\}$ where $$x_j = x_0 + \sum_{i=1}^{k} v_i.$$

Figure 4:
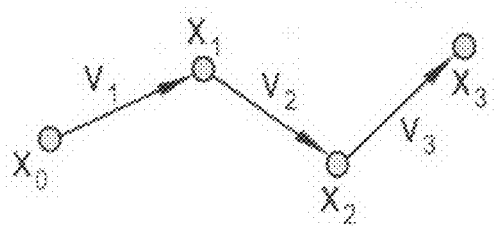
FIG. 4 depicts an exemplary fiber path model, according to an embodiment of the invention.

A simple example of a fiber model with four points $x_0, x_1, x_2, x_3$ connected by displacement vectors $v_1, v_2, v_3$ is depicted in FIG. 4. According to an embodiment of the invention, it can be assumed that the path is arc-length parameterized so that all of the steps $v_i$ are of equal length. Given the diffusion tensor field, $D(x)$, there is a probability associated with each step along the path. In order to impose a smoothness constraint on the path the step probability will be conditioned on the previous step direction. The path has a Markovian property which can also be seen as a mechanical constraint which prevents the fiber from bending too sharply. From $p(v_i|D, v_{i-1})$ one may compute the probability associated with the entire path as the joint probability of the individual steps:

$$p(v_{1:n} | D) = p(v_1 | D) \prod_{i=2}^{n} p(v_i | v_{i-1}, D). \qquad (1)$$

In order to generate random fibers one can start from a point within some region of interest, and draw random steps $v_i$ from some distribution. This distribution will depend on the data, $D$, and the previous step direction, $v_{i-1}$. By Bayes' rule there is $$p(v_i | D, v_{i-1}) = \frac{p(v_{i-1}) p(v_v | v_{i-1}) p(D | v_i, v_{i-1})}{p(D) p(v_{i-1} | D)}. \qquad (2)$$

Assuming D and $v_{i-1}$ are independent, one has $p(D|v_i, v_{i-1}) = p(D|v_i)$ and $p(v_{i-1}|D) = p(v_{i-1})$. Then the posterior distribution becomes $$p(v_i | D, v_{i-1}) = \frac{p(v_i | v_{i-1}) p(D | v_i)}{p(D)}. \qquad (3)$$

Applying Bayes' rule again one obtains $$p(D | v_i) = \frac{p(D) p(v_i | D)}{p(v_i)}. \qquad (4)$$

The posterior distribution can now be rewritten as $$p(v_i | D, v_{i-1}) = \frac{p(v_i | v_{i-1}) p(v_i | D)}{p(v_i)}. \qquad (5)$$

When there is no information about the data or previous direction it can be assumed that all path directions are equally probable, so $p(v_i) =$ constant.

According to an embodiment of the invention, a simple model will be used for the likelihood $p(v_i|D)$, namely, the model used for water diffusion. This model does not take into account noise in the diffusion weighted images or the associated uncertainty in the eigenvector computation. In this case, the posterior distribution represents smoothed water molecule paths.

The molecular diffusion displacement probability distribution function (PDF) is a zero-mean normal distribution, $p(v_i|D) = N(0, D(x))$ with a covariance matrix equal to the diffusion tensor at that voxel. The tractography can be further simplified by assuming a constrained model of diffusion. The constrained model of diffusion is a special case in which molecular displacement is predominantly in a single direction, and displacements in the plane perpendicular to this direction are equal. In terms of the eigenvalues of the diffusion tensor D, $\lambda_1 \geq \lambda_2 = \lambda_3$. This model results in rotationally symmetric diffusion ellipsoids where the axis of symmetry is parallel to the dominant eigenvector, $e_1$. Given a tensor, D, with eigenvalues $\{\lambda_1, \lambda_2, \lambda_3\}$, it can be shown that the nearest constrained tensor has eigenvalues $$\left\{\lambda_1, \frac{\lambda_2 + \lambda_3}{2}, \frac{\lambda_2 + \lambda_3}{2}\right\}.$$

The nearest constrained tensor S can then be written in terms of eigenvalues and eigenvectors of D as $$S = \lambda_1 e_1 e_1^T + \frac{\lambda_2 + \lambda_3}{2}(e_2 e_2^T + e_3 e_3^T), \qquad (6)$$

so that one obtains $$p(v | D) = c \exp\left(-\frac{1}{2} v^T S^{-1} v\right), \qquad (7)$$

where $S^{-1}$ is the inverse of the constrained tensor $S(D)$, and c is a normalization constant. Note that $S^{-1}$ and D have the same eigenvectors, and the eigenvalues of $S^{-1}$ are $$\hat{\lambda}_1 = \frac{1}{\lambda_1}$$

and $$\hat{\lambda}_2 = \hat{\lambda}_3 = \frac{1}{\lambda_2 + \lambda_3}.$$

Using the fact that $I = e_1 e_1^T + e_2 e_2^T + e_3 e_3^T$, one can write $$S^{-1} = \hat{\lambda}_1 e_1 e_1^T + \hat{\lambda}_2 (I - e_1 e_1^T). \qquad (8)$$

Since $v^T e_1 e_1^T v = (v \cdot e_1)^2$, the likelihood may be written as $$p(v|D) = c \exp(-(\hat{\lambda}_1 - \hat{\lambda}_2)(v \cdot e_1)^2 - \hat{\lambda}_2 \|v\|^2). \qquad (9)$$

Note that this is an antipodally symmetric distribution: $p(v) = p(-v)$. For arc-length parameterized fibers, $\|v\|$ is constant, and EQ. (9) is a directional distribution, and that even though it simulates the Gaussian displacement probability, only one eigenvector and 2 eigenvalues are required to compute probabilities using the constrained diffusion model. According to alternative embodiment of the invention, the full tensor can be passed to the GPU to compute the eigenvalues and eigenvectors on the GPU.

The prior distribution imposes a smoothness constraint on the randomly generated paths. A very weak prior assumption is that $(v_i \cdot v_{i-1} > 0)$ so the fiber doesn't turn more than 90 degrees between successive steps. A stronger prior may be formulated as $$p(v_i | v_{i-1}) = c \exp\left(\kappa \left(\frac{v_i}{\|v_i\|}\right)^T \left(\frac{v_{i-1}}{\|v_{i-1}\|}\right)\right). \qquad (10)$$

This is a von-Mises Fisher distribution with concentration parameter κ and mean direction $$\frac{v_{i-1}}{\|v_{i-1}\|}.$$

The parameter κ controls how tightly the distribution is dispersed about the mean direction. The distribution is uniform over the sphere for $\kappa = 0$. Large values of κ give very concentrated distributions and result in smoother paths.

The κ parameter is used to reflect the confidence in the eigenvector $e_1$. In very anisotropic voxels the underlying fiber direction is likely to be parallel to $e_1$, but in isotropic regions the eigenvector becomes less informative. This is when to make the prior most informative. For this reason, according to an embodiment of the invention, κ is chosen to be a decreasing function of FA, such as $\kappa = k_1(1-FA) + k_2$. The prior has a regularizing effect on fiber paths, allowing them to continue tracking through areas of low FA.

Given the parametric forms for the likelihood (EQ. (9)) and prior (EQ. (10)), the posterior may be written as $$p(v_i | D, v_{i-1}) = \qquad (11)$$
$$c \exp\left[-(\hat{\lambda}_1 - \hat{\lambda}_2)(v \cdot e_1)^2 - \hat{\lambda}_2 \|v_i\|^2 + \kappa \left(\frac{v_i}{\|v_i\|}\right)^T \left(\frac{v_{i-1}}{\|v_{i-1}\|}\right)\right].$$

Figure 5:
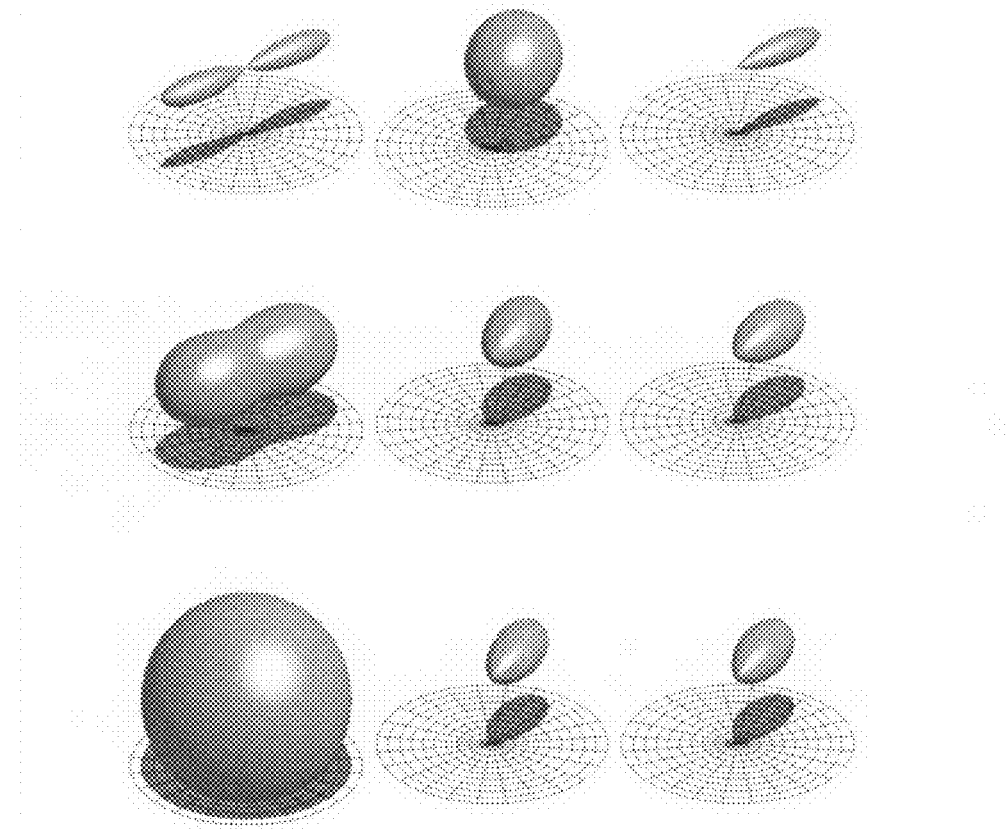
FIG. 5 shows exemplary probability profiles for the likelihood distribution, the prior distribution, and posterior distributions, according to an embodiment of the invention.

FIG. 5 shows exemplary probability profiles for the likelihood distribution in the left column, the prior distribution in the middle column, and posterior distributions shown in the right column for 3 different degrees of anisotropy: FA=0.9 in the top row, FA=0.4 in the center row, and FA=0.005 in the bottom row. When anisotropy is high, shown for FA=0.9 in the top row, the likelihood is very tightly distributed about the mean direction. As FA increases, from top to bottom, the likelihood becomes more dispersed. The likelihood is nearly a uniform distribution in the case where FA=0.005, in the bottom row. The prior distributions were computed using a value of κ corresponding to $k_1 = 5.0$, $k_2 = 1.0$. As diffusion becomes more isotropic, κ increases, and the prior becomes more informative, i.e., less uniform. The posterior distributions reflect the varying influence of the prior distribution. When FA is high, the prior merely selects one of 2 antipodal directions, keeping the fiber from turning 180 degrees in a single step. When FA is low, the mean direction of the posterior is greatly influenced by the prior.

According to an embodiment of the invention, a simple connectivity map may be computed by seeding paths in a user-selected area and accumulating the number of randomly generated paths passing through each voxel in the dataset. As the path progresses more random fibers will be generated. Let the number of fibers passing through voxel x be denoted as $n(x)$ and the total number of generated fibers be N. Assuming that all fiber lengths are equally probable, the probability that the seed voxel $x_0$ is connected to each voxel x can be approximated by $$p_{connect}(x_0 \to x) \approx \frac{n(x)}{N}. \qquad (12)$$

This technique is comparable to integrating over the high dimensional space of all possible fibers by rejection sampling. As N increases one samples more of the space of all possible fibers, and the approximation in EQ. (12) becomes more accurate. By implementing the fiber generation of an embodiment of the invention on the GPU, one can generate many more fibers, and better estimate connection probabilities.

GPU Implementation

According to an embodiment of the invention, the connectivity model described above can be implemented in four stages using the OpenGL shading language. There are several challenges associated with this task.

The GPU cannot generate pseudorandom numbers. Although there is a noise function specified for the fragment programming languages, it is not implemented on current hardware.

It is desired to use 32-bit floating point precision throughout the computation. Textures are typically only 8-bits per channel.

There is no random-access read-write memory on the GPU. Fragment programs generally read from textures and write to predetermined locations in the framebuffer.

Fragment programs cannot write to a slice of a 3D texture. Results must be generated in 2D and mapped to 3D.

The first issue can be overcome by packing pregenerated random numbers into a texture. According to this embodiment, uniformly distributed unit vectors have been placed into a 3D texture. In addition, OpenGL 2.0 supports floating point textures, so 32-bit floating-point values can be used for each component of the random vectors, and also to represent fiber paths. The third issue is commonly addressed in many GPGPU algorithms by "ping-ponging". This involves rendering textured fragments into a framebuffer object bound to another texture. After each iteration the input texture and framebuffer texture are swapped. This allows the results that were rendered to the framebuffer object to be read back into the fragment program on the next iteration. The swap is done by changing binding points, not by copying data. In fact, this framework can be implemented without any slow copying operations. The "ping-ponging" operation does, however, double the required memory for variables, so for large datasets copying may be necessary.

Figure 6:
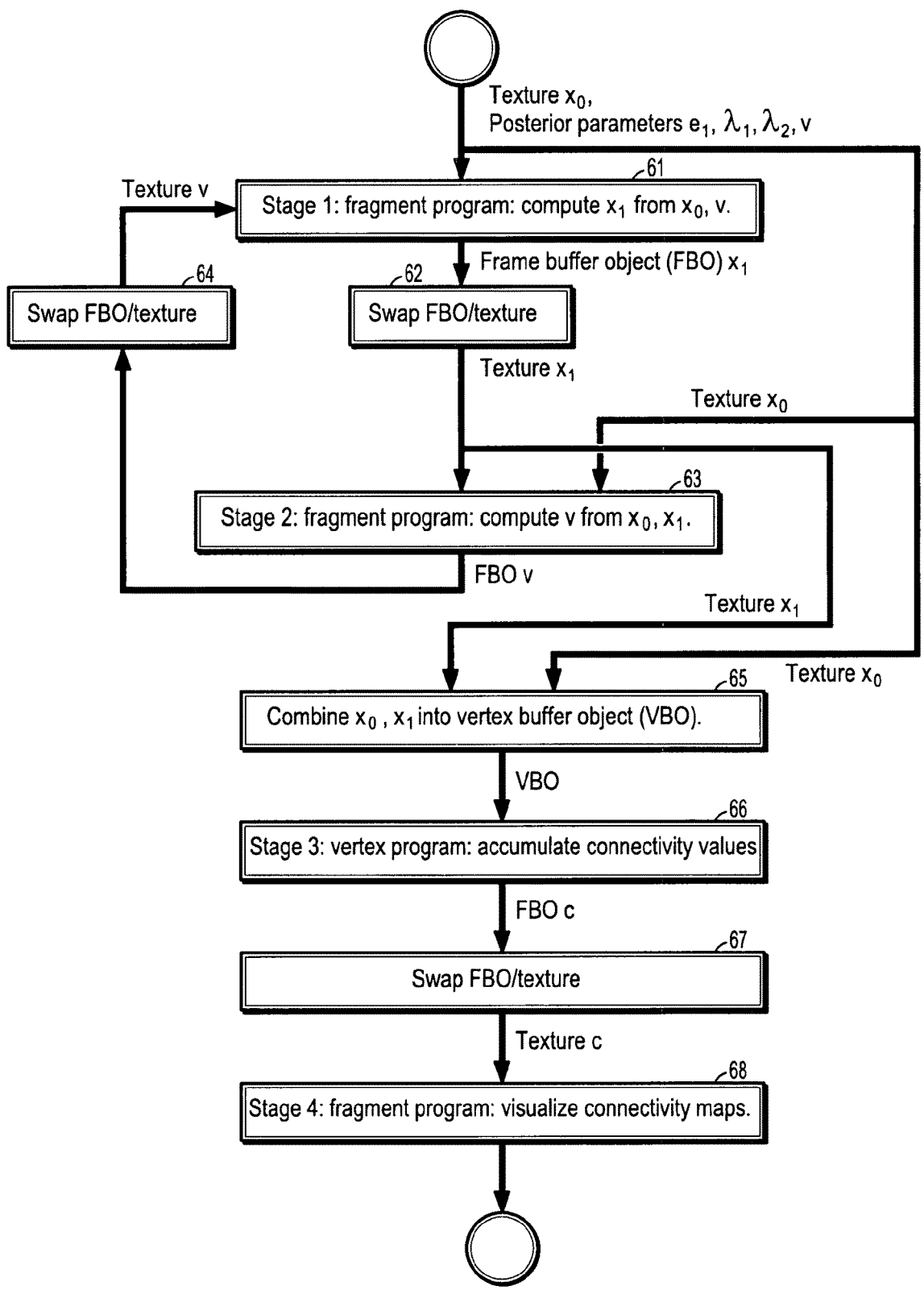
FIG. 6 is a flow diagram of the GPU computations, according to an embodiment of the invention.

FIG. 6 is a flow diagram of the stages and the data flow of the GPU computations. A GPU tractography implementation according to an embodiment of the invention works in several stages. Each stage has one rendering pass for the variable which is being updated. The variables $x_0$ and $x_1$ are particle positions, and v represents the fiber displacement vectors. Inputs to stages 1, 2 and 4 are textures, the input to stage 3 is a vertex buffer object (VBO). Outputs from stages 1, 2, and 3 are rendered into off-screen frame buffer objects (FBOs). The final pass, stage 4, renders the visible result.

Some initialization is required on the host CPU before a GPU based algorithm can run, to create and initialize the required OpenGL textures and buffer objects. The initial positions $x_0$ generated on the CPU, and are uniformly randomly distributed throughout the region of interest. The dimensions of the textures $x_0$, $x_1$, v are all the same, and depend on how many fibers are to be simulated. Square (n×n), power-of-2 textures are used since these are still generally more efficient on modern hardware. The textures containing the eigenvector $e_1$ and eigenvalues $\lambda_1$ and $\lambda_2$ are 3D textures having the same dimensions as the dataset. A frame buffer object (FBO) is created so that the rendering in stages 1, 2, and 3 is output to the appropriate buffer, not the screen. The vertex buffer object is created to hold $n^2$ vertices, and bound to GL_PIXEL_PACK_BUFFER. The algorithm will be rendering to a vertex buffer object which will later be drawn as point sprites.

Referring now to the figure, a GPU tractography according to an embodiment of the invention begins by providing the initial positions $x_0$ in a texture and posterior distribution parameters $e_1$, $\lambda_1$, $\lambda_2$, $v_{i-1}$ as arguments to stage 1, step 61. The posterior distribution parameters can be computed by stochastic interpolation. The stage 1 fragment program 61 draws random displacements from the posterior distribution given in EQ. (11), and computes new particle positions $x_1$. A particle position is reinitialized if $x_1$ is outside of the white/gray matter domain. The new particle positions are output as an FBO, which is swapped with a texture at step 62.

Stage 2, at step 63, is a fragment program that updates the displacement vectors $v_i$ from the current and previous positions, $x_0$ and $x_1$. The updated displacements are output as an FBO, which is swapped with a texture at step 64, and provided as an argument to the stage 1 fragment program at step 61.

The textures x0 and x1 are combined into a vertex buffer object (VBO) at step 65. OpenGL buffer objects are currently flexible enough to be interpreted as vertex positions (x,y,z) or colors (r,g,b). Thus, the same data which is used as a color texture in stage 1 can be reused in stage 3 as vertices. This VBO is the input to the vertex program of stage 3 at step 66. This vertex program accumulates connectivity values using additive alpha blending. This is a way of accumulating values in the frame buffer. At this stage, if a fragment at position (x,y) with intensity (I) and alpha value (α) is processed, the intensity in the buffer at position (x,y) will be incremented by α×I. If particle has crossed a voxel boundary, then the point sprite color is white, otherwise the point sprite color is black, alpha=0. The accumulated value is scaled by the factor alpha. The connectivity values c are output to an FBO that is swapped with a texture at step 67.

Stage 4, at step 68, is a fragment program that visualizes the connectivity textures by rendering to a screen. If a connectivity value is nonzero, then a fragment intensity is computed, otherwise the voxel is rendered as black, alpha=0.

These fragment programs are described in detail below.

Stage 1

The first two stages are common to many GPU-based particle advection schemes. The viewport size is set to be equal to the size of texture $x_0$. A full-screen textured quadrilateral is drawn so that one fragment is generated per particle. The fragment processor computes the new position, and outputs this as the fragment color. Buffers $x_0$ and $x_1$ are swapped in ping-pong fashion after each iteration. A novel aspect of an implementation of stages 1 and 2 according to an embodiment of the invention is that the displacements are stochastic, not deterministic. The fiber model is specified by the fragment program at this stage. Other models, deterministic or stochastic, can be explored by substituting this fragment program.

Since the tensor data only exists on lattice points of a discrete grid, some form of interpolation is necessary when fiber path vertices fall between lattice points. It is possible to interpolate between tensors and recompute the eigenvalues at each iteration, but this adds much computational burden. Stochastic interpolation, however, reflects the underlying uncertainty in the data. One exemplary scheme randomly selects a tensor from the nearest neighbors. In 1-D, stochastic interpolation according to an embodiment of the invention is defined by $$D(x) = \begin{cases} D(\lfloor x \rfloor), & \text{if } U(0,1) > x - \lfloor x \rfloor, \\ D(\lceil x \rceil), & \text{otherwise.} \end{cases} \quad (13)$$

where $\lfloor \ \rfloor$ and $\lceil \ \rceil$ denote the floor and ceiling functions respectively, and $U(0,1)$ returns a random value uniformly distributed between 0 and 1. If x is very close to $\lfloor x \rfloor$, then $D(\lfloor x \rfloor)$ is very likely to be the interpolated value, but as $x-\lfloor x \rfloor$ approaches 0.5, both $D(\lfloor x \rfloor)$ and $D(\lceil x \rceil)$ become equally likely. This means that two fiber paths which go though the same point may compute different interpolated values. EQ. (13) can be easily extended to higher dimensional interpolation. Stochastic interpolation in 3D can be performed using the following exemplary, non-limiting sequence of GLSL code:

vec3 *u*=texture3D(*umap, pos.xyz+seed.xyz*);

vec3 *f*=*fract*(*pos.xyz*);

vec3 *c*=*ceil*(*pos.xyz*);

vec3 *ipos*=*c*−((*u<f*)? 0:1);

where umap is a texture containing uniform random values in each color component, pos is a texture position and seed is an offset into the random texture which changes each iteration. The conditional expression for ipos is evaluated componentwise for the vector arguments, and implements a 3D version of EQ. (13).

Figure 7:
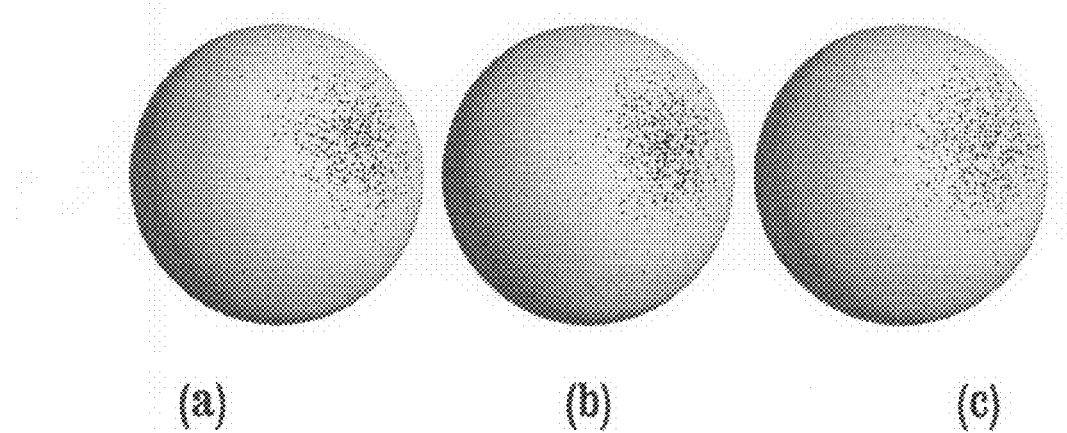
FIGS. 7(a)-(c) depicts the results of drawing random samples from a discrete posterior using the inversion method, according to an embodiment of the invention.

According to an embodiment of the invention, the drawing of random samples from a non-uniform distribution to generate random fiber directions can be accomplished by an inversion method. Given a univariate probability density function, f (x), the inversion method entails inverting the cumulative distribution F to obtain $F^{-1}(x)$. If U is uniform on the interval [0,1], then $F^{-1}(U)$ has distribution function F and density f. This concept can be applied to multivariate distributions by discretizing the continuous density function into a fixed number of bins. FIGS. 7(a)-(c) depicts the results of drawing 1000 random samples from the discrete posterior using the inversion method. The posterior has been discretized into 5000 bins, shown in FIG. 7(a), 500 bins, shown in FIG. 7(b), and 50 bins, shown in FIG. 7(c). For each sample, the locations of the bins were chosen randomly to be uniformly distributed over the sphere. As the number of bins increases the discrete distribution approaches the continuous distribution and the sampling improves. However more bins leads to a slower sampling scheme. The effect of a small bin number can be seen in FIG. 7(c), where the peaks of the distribution are undersampled. In other words, the variance of the discrete posterior is artificially high.

Figure 8:
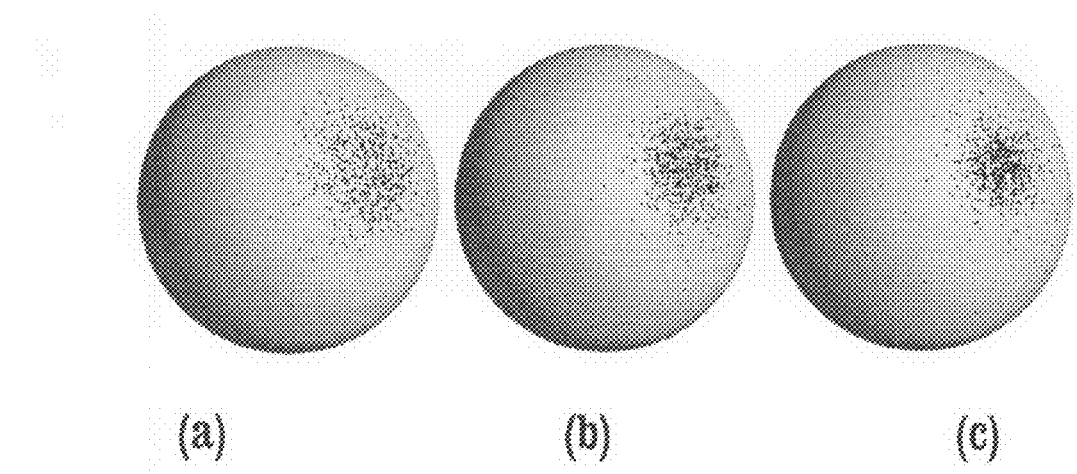
FIGS. 8(a)-(c) depicts the results of decreasing the dispersion of the sampled points, according to an embodiment of the invention.

According to an embodiment of the invention, a small contribution from the expected value, $\bar{v}=\Sigma p(v) v$, of the discrete distribution is added, so that the chosen direction can be computed by $v^*=\gamma v+(1-\gamma)\bar{v}$. The effect of the parameter $\gamma$ on the sampled points is shown in FIGS. 8(a)-(c), in which increasing $\gamma$ decreases the dispersion of the sampled points: $\gamma=0.25$, shown in FIG. 8(a), $\gamma=0.5$, shown in FIG. 8(b), and $\gamma=0.75$, shown in FIG. 8(c).

Fiber tracking will cease when the path exits the dataset, or the fractional anisotropy value falls below a certain threshold representing cerebro-spinal fluid (CSF). When a fiber can no longer be tracked, it is randomly reinitialized within the initial region of interest. This way a constant number of fibers per iteration can be tracked Stage 2

In stage 2, the textures $x_0$ and $x_1$ are read as inputs by the fragment program, and the output is rendered into v. The fragment program updates the current direction: $v=x_1-x_0$. An exemplary fragment program according to an embodiment of the invention is given below:

```
uniform sampler2D x0;
uniform sampler2D x1;
void main( ) {
    vec4 pos0 = texture2D(x0, gl_TexCoord[0].st);
    vec4 pos1 = texture2D(x1, gl_TexCoord[0].st);
    vec4 v = pos1-pos0;
    gl_FragColor = v;
}
```

Although the advecting particles ($x_1$) can be visualized directly after stage 2 as point sprites, a connectivity map is computed instead.

Note that this stage provides an extra pass to output additional vectors from the fragment program. However, more modern hardware supports multiple render targets so that multiple vectors may be output from a fragment program. This would allow stages 1 and 2 to be collapsed into a single stage in another embodiment of the invention.

Stage 3

The values being accumulated in this stage is a scaled count of how many fibers which start at a particular voxel enter each voxel in the dataset. If a voxel is never entered by any fiber, then zeros will be accumulated, resulting in 0. If a fiber is entered n times, the intensity at that voxel will be (alpha×n).

The data is kept entirely on the GPU for rendering by binding the $x_0$ texture to a VBO and calling the OpenGL function glDrawArrays. Rendering at stage 3 is also off-screen, to a frame buffer object. The particle position buffer is bound to a vertex buffer object, and the previous position buffer is bound to a vertex attribute. The vertex normal is used to hold the previous position, although user-defined attributes may be used. The previous connectivity map is rendered as a textured quad. The vertex buffer is rendered as points with additive alpha blending and depth testing disabled.

Connectivity values are accumulated in a one-voxel thick slab at a time. This is performed by setting the projection matrix to be orthogonal with the near clipping plane at the front face of the current slab and the far clipping plane at the back face of the slab. Stage 3 should be repeated for each slab for which connectivity information is to be computed.

An exemplary vertex program according to an embodiment of the invention for this stage is given below.

```
void main( ) {
    gl_FrontColor = vec4(0.0, 0.0, 0.0, 0.0);
    vec3 ipos = floor(gl_Vertex.xyz);
    vec3 iprev = floor(gl_Normal.xyz); //previous position
    if( any( notEqual( ipos, iprev ) ) ) {
        gl_FrontColor = vec4(1.0, 1.0, 1.0, 1.0/256.0);
    }
}
```

Here the floor command returns a vector containing the floor of each vector component. The notEqual function returns the vector of boolean values obtained by comparing the components of the input arguments. The function any returns true if any element of the input vector is true, otherwise false is returned. The effect of this fragment program is that when a particle enters a new voxel, the particle is colored white with a small constant alpha value. Since additive alpha blending is used in stage 3, a small constant value, $\alpha$, gets added to the previous connectivity value. The particles are rendered as 1 pixel point so only the voxel being entered has the connectivity value incremented.

Stage 4

Stage 4 is a color mapping stage where colors are assigned to connectivity values. The rendering performed in Stage 4 is to a screen so that it is visible. Since the actual probability values are small, a negative logarithm of the probabilities is used as a base intensity value. The value of N here is estimated by the user as part of the color mapping process. The connectivity values c(x) in the floating point texture output from stage 3 are not actual fiber counts n(x), but scaled counts $\alpha n(x)$. The total number of fibers generated during simulation is not kept. However, if the region of interest was a single voxel $x_0$, then $c(x_0)=\alpha N$, and the connectivity probabilities can be recovered as $$p_{connect}(x_0 \rightarrow x) = \frac{c(x)}{c(x_0)}.$$

Experimental Results

A connectivity algorithm according to an embodiment of the invention was implemented two ways. First, a C++ implementation was written for execution on a host PC featuring a Pentium 4 3.2 GHz CPU and 2 GB RAM. Second, a GPU-based implementation was written using OpenGL 2.0 and GLSL. The GPU used was a GeForce 7800 GTX on a video card with 256 MB VRAM. The dataset studied had matrix size is 148×190×160, and the voxels measure 1.0 mm×1.0 mm×1.0 mm.

Many paths can be simulated, exploiting the parallelism of the fragment processors, but the size of the fragment programs is limited. To eliminate branching, loops are unrolled by the compiler, when possible, which leads to a longer fragment program. Using more than 50 bins when discretizing the posterior distribution on the GPU leads to a dramatic drop in performance, suggesting that OpenGL has fallen back to a software path for rendering because the fragment program has exceeded the allowable length. As a result, the posterior distribution may be undersampled, leading to more dispersed fiber paths. This can be compensated for by setting the parameter γ as described above. A value of γ=0.5 was used to generate the results below.

FIGS. 9-12 depict results of connectivity computed from seed points in different part of a brain. The connectivity images were computed on the GPU, then the 2D connectivity slices were assembled into a 3D texture and volume rendered. Connectivity values are overlaid on FA images for reference. The connectivity values in each image are indicated by reference number 100, and the brightness of the connectivity regions is indicative of connection probability. For FIGS. 9, 10, and 11, the left and right panes are showing the same tracts from 2 different viewpoints. For FIG. 12, the left and right panes are showing different tracts.

Figure 9:
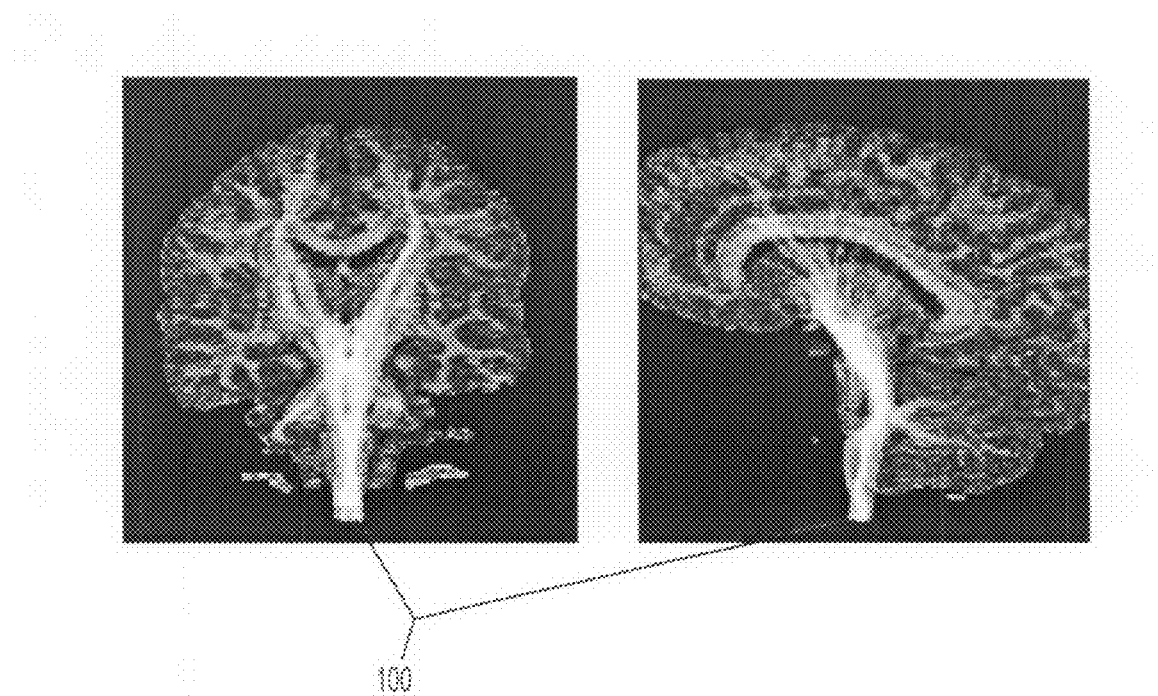
FIG. 9 depicts results of connectivity computed from seeding the fiber tracts near the pons in the brain stem, according to an embodiment of the invention.

FIG. 9 is the result of seeding the fiber tracts near the pons in the brain stem. It is known that this area is connected to the internal capsule from which fibers fan out toward the cortical surface. The connectivity map reflects these connections.

Figure 10:
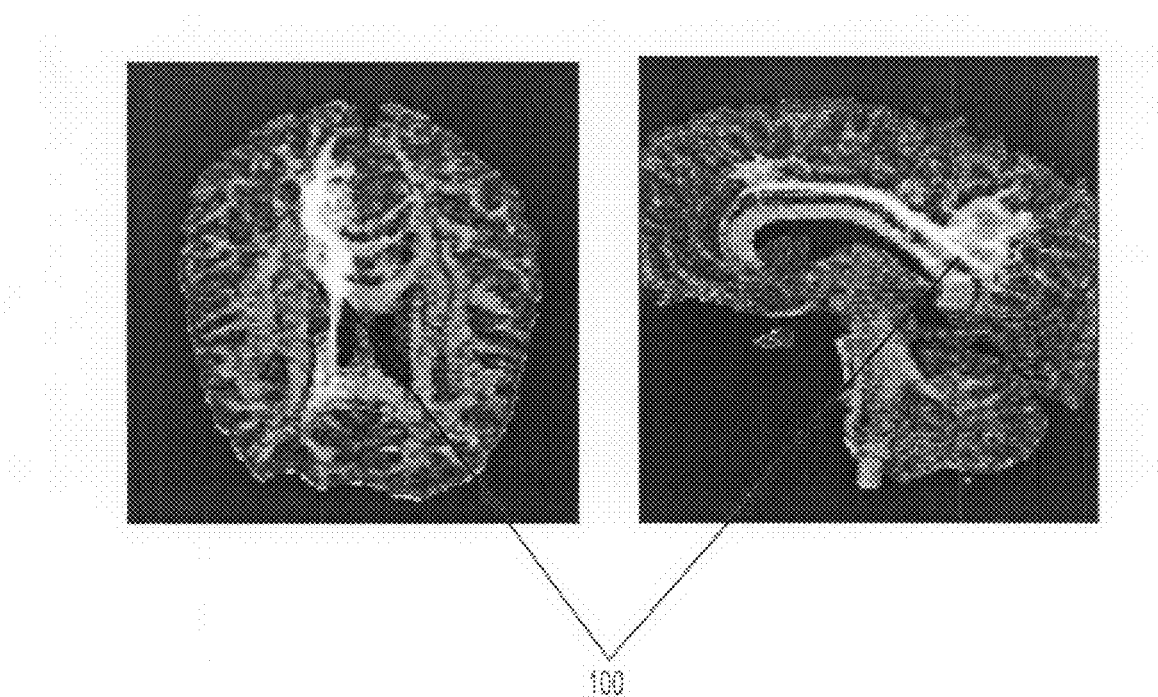
FIG. 10 depicts results of connectivity computed from selecting the seed point to be within the cingulum bundle, according to an embodiment of the invention.
Figure 11:
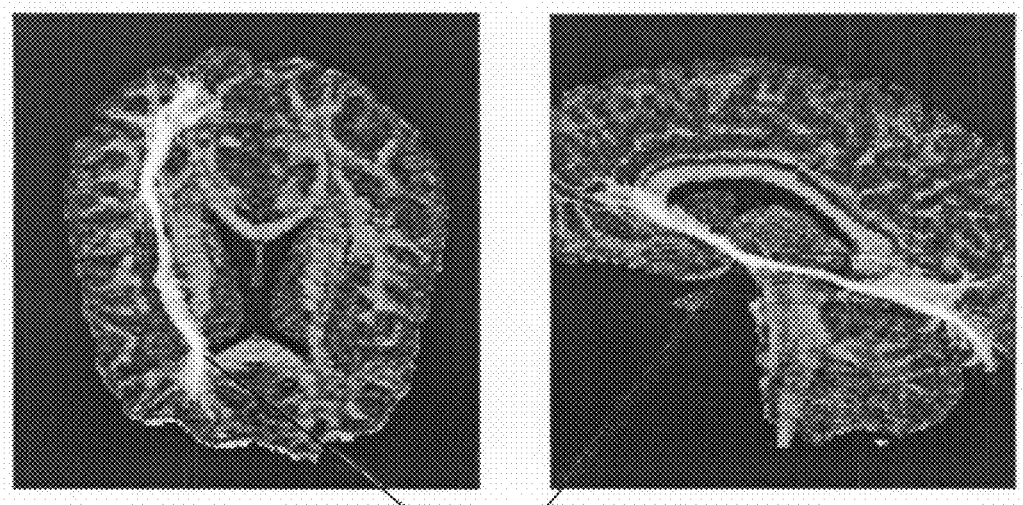
FIG. 11 depicts results of connectivity computed from seeding fibers in the occipitofrontal fasciculus, according to an embodiment of the invention.
Figure 12:
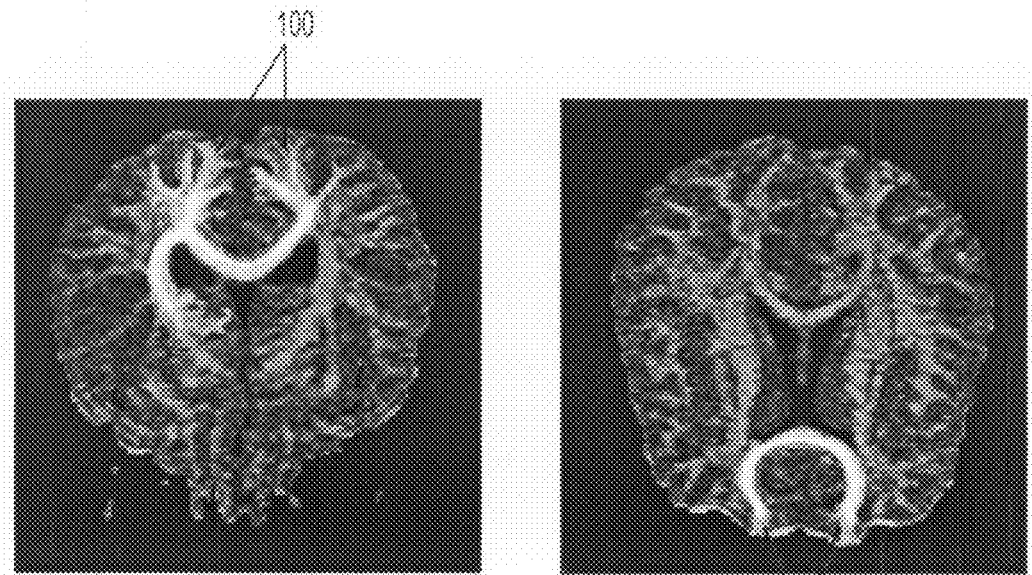
FIG. 12 depicts results of connectivity computed from seeding fibers in the splenium and genu of the corpus callosum, according to an embodiment of the invention.

FIG. 10 was generated by selecting the seed point to be within the cingulum bundle. These fibers arch over the corpus callosum in the anterior-posterior direction. FIG. 11 shows the results of seeding in the occipitofrontal fasciculus. As expected, the connectivity map shows that this structure connects the frontal and occipital lobes of the brain. FIG. 12 was the result of seeding fibers in the splenium and genu of the corpus callosum. This structure is known to connect the left and right hemispheres of the brain, a fact reflected in the connectivity map.

These results were computed by simulating over 250000 particles (a 512×512 buffer) advecting stochastically along fiber paths. The results of the reference CPU algorithm were similar to those of the GPU, however the CPU algorithm requires more time to simulate. For each iteration, all particle displacements and positions were updated and the fiber counts for each voxel were updated. On the CPU each iteration required 13.6 seconds, but on the GPU only 0.46 seconds, a speedup of almost 30 times.

It is to be understood that the fiber model presented herein is exemplary and non-limiting, and other fiber models can be accommodated by a GPU-based connectivity mapping algorithm according to other embodiments of the invention.

System Implementation

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 13:
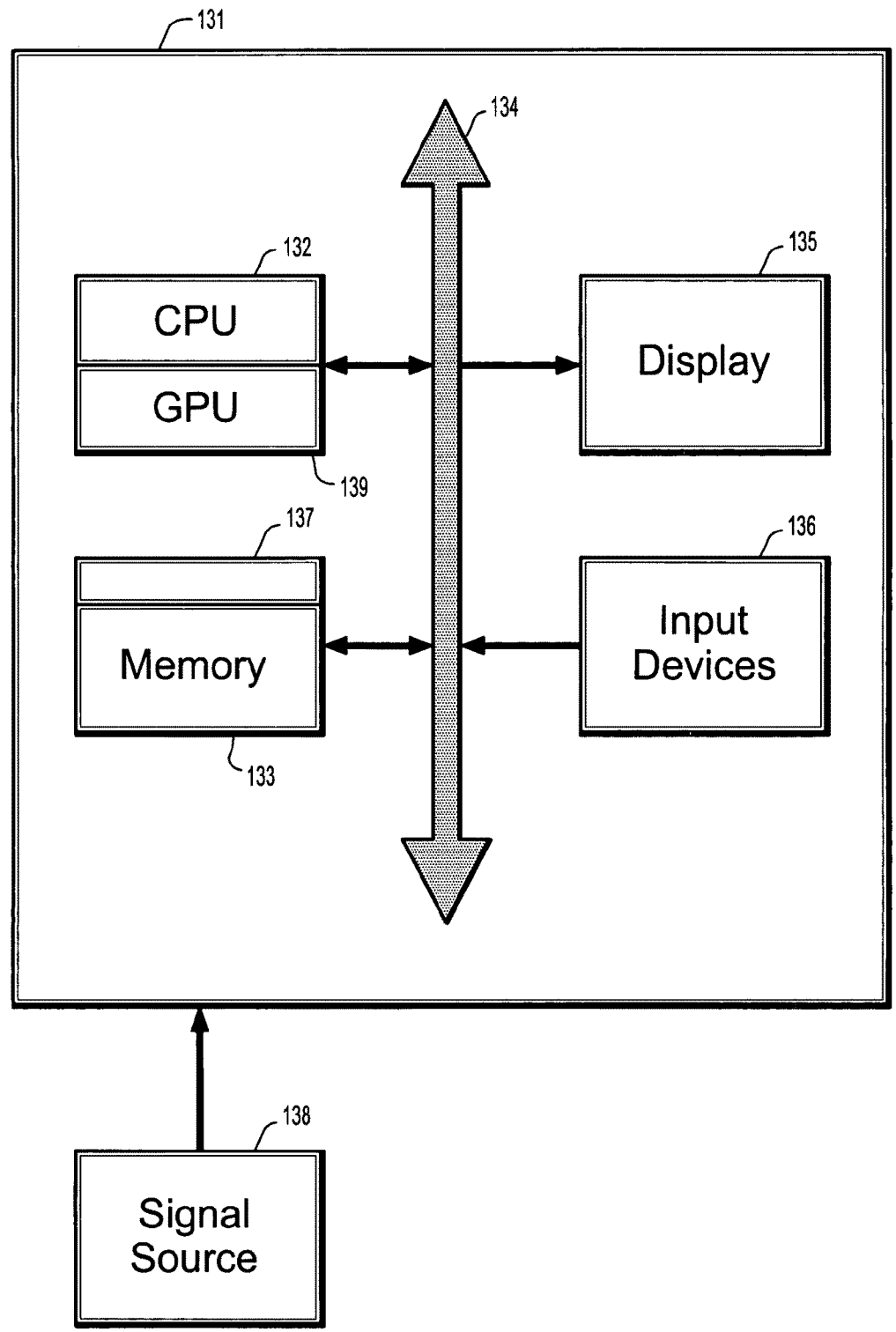
FIG. 13 is a block diagram of an exemplary computer system for implementing fiber tract mapping from diffusion tensor magnetic resonance imaging (DT-MRI) on the GPU, according to an embodiment of the invention.

FIG. 13 is a block diagram of an exemplary computer system for implementing fiber tract mapping from diffusion tensor magnetic resonance imaging (DT-MRI) on the GPU, according to an embodiment of the invention. Referring now to FIG. 13, a computer system 131 for implementing the present invention can comprise, inter alia, a central processing unit (CPU) 132, a graphics processing unit (GPU) 139, a memory 133 and an input/output (I/O) interface 134. The computer system 131 is generally coupled through the I/O interface 134 to a display 135 and various input devices 136 such as a mouse and a keyboard. The support circuits can include circuits such as cache, power supplies, clock circuits, and a communication bus. The memory 133 can include random access memory (RAM), read only memory (ROM), disk drive, tape drive, etc., or a combinations thereof. The present invention can be implemented as a routine 137 that is stored in memory 133 and executed by the CPU 132 and GPU 139 to process the signal from the signal source 138. As such, the computer system 131 is a general purpose computer system that becomes a specific purpose computer system when executing the routine 137 of the present invention.

The computer system 131 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to a preferred embodiment, those skilled in the art will appreciate that various modifications and substitutions can be made thereto without departing from the spirit and scope of the invention as set forth in the appended claims.

What is claimed is:

1. A graphics processing unit implemented method for fiber tract mapping from diffusion tensor magnetic resonance imaging data, said method comprising the steps of:

providing a digitized brain image volume comprising a plurality of 3×3 diffusion tensors corresponding to a 3-dimensional grid of points;

initializing a set of fiber positions in a 3D set of points, fiber displacements, and a posterior distribution for an updated fiber displacement in terms of the initial displacements and diffusion tensors, wherein said posterior distribution is $$\exp\left[-(\hat{\lambda}_1 - \hat{\lambda}_2)(v \cdot e_1)^2 - \hat{\lambda}_2\|v_i\|^2 + \kappa\left(\frac{v_i}{\|v_i\|}\right)^T\left(\frac{v_{i-1}}{\|v_{i-1}\|}\right)\right],$$

wherein c is a normalization constant, $v_i$ and $v_{i-1}$ are, respectively, the updated and initial fiber displacements, $e_1$ is a dominant eigenvalue of the diffusion tensor at a given point, $$\hat{\lambda}_1 = \frac{1}{\lambda_1}$$

wherein $\lambda_1$ is the eigenvalue associated with $e_1$, $$\hat{\lambda}_2 = \frac{2}{\lambda_2 + \lambda_3}$$

wherein $\lambda_2$ and $\lambda_3$ are the other eigenvalues of the diffusion tensor, and $\kappa$ is parameter that characterizes how tightly said posterior distribution is dispersed about a mean direction;

randomly sampling a set of updated fiber displacements from said posterior distribution;

computing a new set of fiber positions from said initial fiber positions and said updated fiber displacements, wherein a fiber path comprises a set of fiber points connected by successive fiber displacements;

accumulating connectivity values in each point of said 3D set of points by additive alpha-blending a scaled value if a fiber path has passed through a point and adding zero if not; and rendering said connectivity values, wherein said steps of initializing a set of fiber positions, randomly sampling a set of updated fiber displacements, computing a new set of fiber positions, accumulating connectivity values, and rendering said connectivity values are performed by a graphics processing unit.

2. The method of claim 1, wherein said initial fiber positions and fiber displacements are stored as textures, said new fiber positions are output into a frame buffer object, and further comprising swapping said new fiber positions frame buffer object with a texture.

3. The method of claim 1, wherein said steps of randomly sampling a set of updated fiber displacements and computing a new set of fiber positions are performed by a fragment program.

4. The method of claim 1, further comprising correcting said updated fiber displacements from said new set of fiber positions in a fragment program, outputting said corrected displacements to a frame buffer object, and swapping said frame buffer object with a texture.

5. The method of claim 1, wherein said step of accumulating connectivity values is performed by a vertex program.

6. The method of claim 5, further comprising combining said initial fiber positions and said new fiber positions into a vertex buffer object that is an argument to said vertex program, outputting said connectivity values into a frame buffer object, and swapping said frame buffer object with a texture.

7. The method of claim 1, wherein rendering said connectivity values includes mapping colors to said connectivity values.

8. The method of claim 1, further comprising terminating fiber tract mapping of a fiber path when said fiber path exits said 3D set of points or if a normalized variance of the eigenvalues of the diffusion tensor of a point on the fiber path falls below a pre-determined threshold, and randomly reinitializing said terminated fiber path within the 3D set of points.

9. The method of claim 1, further comprising adjusting said randomly sampled displacements according to $\gamma v + (1-\gamma)\bar{v}$, wherein $v$ is said randomly sampled displacement, $\bar{v}$ is an average value of said displacements, and $\gamma$ is a pre-determined parameter that corrects for undersampling said distribution.

10. The method of claim 1, wherein initializing said posterior distribution includes stochastically interpolating values for $v_{i-1}$, $e_1$, $\hat{\lambda}_1$ and $\hat{\lambda}_2$.

11. The method of claim 1, further comprising stochastically interpolating a diffusion tensor $D(x)$ when a new fiber position x falls between set points, wherein $$D(x) = \begin{cases} D(\lfloor x \rfloor), & \text{if } U(0,1) > x - \lfloor x \rfloor, \\ D(\lceil x \rceil), & \text{otherwise.} \end{cases}$$

and wherein $U(0,1)$ returns a random value uniformly distributed between 0 and 1.

12. A program storage device readable by a computer, tangibly embodying a program of instructions executable by the computer to perform the method steps for fiber tract mapping from diffusion tensor magnetic resonance imaging data, said method comprising the steps of:

providing a digitized brain image volume comprising a plurality of 3×3 diffusion tensors corresponding to a 3-dimensional grid of points;

initializing a set of fiber positions in a 3D set of points, fiber displacements, and a posterior distribution for an updated fiber displacement in terms of the initial displacements and diffusion tensors, wherein said posterior distribution is $$\exp\left[-(\hat{\lambda}_1 - \hat{\lambda}_2)(v \cdot e_1)^2 - \hat{\lambda}_2 \|v_i\|^2 + \kappa\left(\frac{v_i}{\|v_i\|}\right)^T \left(\frac{v_{i-1}}{\|v_{i-1}\|}\right)\right],$$

wherein c is a normalization constant, $v_i$ and $v_{i-1}$ are, respectively, the updated and initial fiber displacements, $e_1$ is a dominant eigenvalue of the diffusion tensor at a given point, $$\hat{\lambda}_1 = \frac{1}{\lambda_1}$$

wherein $\lambda_1$ is the eigenvalue associated with $e_1$, $$\hat{\lambda}_2 = \frac{2}{\lambda_2 + \lambda_3}$$

wherein $\lambda_2$ and $\lambda_3$ are the other eigenvalues of the diffusion tensor, and $\kappa$ is parameter that characterizes how tightly said posterior distribution is dispersed about a mean direction;

randomly sampling a set of updated fiber displacements from said posterior distribution;

computing a new set of fiber positions from said initial fiber positions and said updated fiber displacements, wherein a fiber path comprises a set of fiber points connected by successive fiber displacements;

accumulating connectivity values in each point of said 3D set of points by additive alpha-blending a scaled value if a fiber path has passed through a point and adding zero if not; and rendering said connectivity values, wherein said steps of sampling updated fiber displacements, computing a new set of fiber positions, accumulating connectivity values, and rendering said connectivity values are performed by a graphics processing unit.

13. The computer readable program storage device of claim 12, wherein said initial fiber positions and fiber displacements are stored as textures, said new fiber positions are output into a frame buffer object, and further comprising swapping said new fiber positions frame buffer object with a texture.

14. The computer readable program storage device of claim 12, wherein said steps of randomly sampling a set of updated fiber displacements and computing a new set of fiber positions are performed by a fragment program.

15. The computer readable program storage device of claim 12, the method further comprising correcting said updated fiber displacements from said new set of fiber positions in a fragment program, outputting said corrected displacements to a frame buffer object, and swapping said frame buffer object with a texture.

16. The computer readable program storage device of claim 12, wherein said step of accumulating connectivity values is performed by a vertex program.

17. The computer readable program storage device of claim 16, the method further comprising combining said initial fiber positions and said new fiber positions into a vertex buffer object that is an argument to said vertex program, outputting said connectivity values into a frame buffer object, and swapping said frame buffer object with a texture.

18. The computer readable program storage device of claim 12, wherein rendering said connectivity values includes mapping colors to said connectivity values.

19. The computer readable program storage device of claim 12, the method further comprising terminating fiber tract mapping of a fiber path when said fiber path exits said 3D set of points or if a normalized variance of the eigenvalues of the diffusion tensor of a point on the fiber path falls below a pre-determined threshold, and randomly reinitializing said terminated fiber path within the 3D set of points.

20. The computer readable program storage device of claim 12, the method further comprising adjusting said randomly sampled displacements according to $\gamma v+(1-\gamma)\bar{v}$, wherein v is said randomly sampled displacement, $\bar{v}$ is an average value of said displacements, and $\gamma$ is a pre-determined parameter that corrects for undersampling said distribution.

21. The computer readable program storage device of claim 12, wherein initializing said posterior distribution includes stochastically interpolating values for $v_{i-1}, e_1, \hat{\lambda}_1$ and $\hat{\lambda}_2$.

22. The computer readable program storage device of claim 12, the method further comprising stochastically interpolating a diffusion tensor D(x) when a new fiber position x falls between set points, wherein $$D(x) = \begin{cases} D(\lfloor x \rfloor), & \text{if } U(0,1) > x - \lfloor x \rfloor, \\ D(\lceil x \rceil), & \text{otherwise.} \end{cases}$$

and wherein U(0,1) returns a random value uniformly distributed between 0 and 1.

* * * * *